(12) United States Patent
Kung

(10) Patent No.: US 12,276,698 B2
(45) Date of Patent: Apr. 15, 2025

(54) TESTING SYSTEM AND TESTING METHOD

(71) Applicant: ASMedia Technology Inc., New Taipei (TW)

(72) Inventor: Te-Ming Kung, New Taipei (TW)

(73) Assignee: ASMedia Technology Inc., New Taipei (TW)

( * ) Notice: Subject to any disclaimer, the term of this patent is extended or adjusted under 35 U.S.C. 154(b) by 0 days.

(21) Appl. No.: 18/312,600

(22) Filed: May 5, 2023

(65) Prior Publication Data

US 2024/0345164 A1 Oct. 17, 2024

(30) Foreign Application Priority Data

Apr. 12, 2023 (TW) .................. 112113717

(51) Int. Cl.
 *G01R 31/3185* (2006.01)
 *G01R 31/317* (2006.01)
 *G01R 31/3183* (2006.01)
(52) U.S. Cl.
 CPC ............... *G01R 31/318572* (2013.01); *G01R 31/31723* (2013.01); *G01R 31/318371* (2013.01)
(58) Field of Classification Search
 CPC ...... G01R 31/318572; G01R 31/31723; G01R 31/318371
 See application file for complete search history.

(56) References Cited

U.S. PATENT DOCUMENTS

2019/0196924 A1 6/2019 Gregg et al.
2022/0236939 A1* 7/2022 Thien ................. G06F 13/4022

FOREIGN PATENT DOCUMENTS

| CN | 102043748 | 5/2011 |
|----|-----------|--------|
| CN | 105653417 | 6/2016 |
| CN | 214585758 | 11/2021 |
| CN | 115454903 | 12/2022 |
| TW | I533121 | 5/2016 |
| TW | 201809691 | 3/2018 |
| TW | 202143045 | 11/2021 |
| TW | I785322 | 12/2022 |

OTHER PUBLICATIONS

"Office Action of Taiwan Counterpart Application", issued on Jul. 26, 2023, p. 1-p. 5.

* cited by examiner

*Primary Examiner* — Thien Nguyen
(74) *Attorney, Agent, or Firm* — JCIPRNET

(57) ABSTRACT

A testing system and a testing method are provided. The testing system includes a first testing device and a second testing device. The first testing device is coupled to a first stream facing-port of a device under test (DUT). The first testing device includes a controller. The second testing device is coupled to a second stream facing-port of the DUT. The controller transmits a testing signal to the DUT through the first stream facing-port to test a universal serial bus (USB) of the DUT. The DUT is operated based on the testing signal to generate a data signal. The DUT outputs the data signal to the second testing device through the second stream facing-port. The second testing device obtains status information of the DUT which is operated based on the testing signal to generate a testing result. The controller determines whether the DUT is normal according to the testing result.

9 Claims, 8 Drawing Sheets

TESTING SYSTEM AND TESTING METHOD

CROSS-REFERENCE TO RELATED APPLICATION

This application claims the priority benefit of Taiwan application serial no. 112113717, filed on Apr. 12, 2023. The entirety of the above-mentioned patent application is hereby incorporated by reference herein and made a part of this specification.

BACKGROUND

Technical Field

The disclosure relates to a testing system, and particularly to a testing system and a testing method that applies universal serial bus (hereinafter referred to as USB).

Description of Related Art

A USB is a standard for connecting two electronic devices for transmission. The latest USB is compatible with the old USB transmission specification, and may also support other transmission specifications at the same time. The transmission specification may be, for example, PCI Express (PCIe) transmission specification, display port (DP) transmission specification, and USB3 transmission specification (i.e., USB3 tunneling) that utilizes tunneling specification for transmission.

Generally, in order to test various transmission specifications, testing devices may upload a program for test to a device under test through an interface circuit, so a processing element of the device under test may execute the program to complete the test. However, the current testing device cannot test multiple transmission specifications of the device under test through a single program, especially the PCIe and DP transmission specifications, which are unable to be tested, resulting in low test efficiency.

SUMMARY

The disclosure provides a testing system that may improve test efficiency.

The testing system in embodiments of the disclosure includes a first testing device and a second testing device. The first testing device is coupled to a first stream facing-port of a device under test. The first testing device includes a controller. The second testing device is coupled to a second stream facing-port of the device under test. The controller is configured to transmit a testing signal to the device under test through the first stream facing-port to test a universal serial bus (USB) of the device under test. The device under test is configured to operate based on the testing signal to generate a data signal, so that the device under test outputs the data signal to the second testing device through the second stream facing-port and the second testing device obtains status information of the device under test which is operated based on the testing signal to generate a testing result. The controller determines whether the device under test is normal according to the testing result.

The embodiment of the disclosure further provides a testing method. The testing method is described below. A testing signal is transmitted to a device under test through a controller of a first testing device through a first stream facing-port of the device under test to test a USB of the device under test. The controller is coupled to the first stream facing-port. A data signal is generated through the device under test operating based on the testing signal. The data signal output by the device under test is received through a second testing device via a second stream facing-port of the device under test. The second testing device is coupled to the second stream facing-port. Status information of the device under test which is operated based on the testing signal is obtained through the second testing device to generate a testing result. The controller determines whether the device under test is normal according to the testing result.

Based on the above, the testing system and testing method of the embodiment of the disclosure connect multiple testing devices in series with the device under test in a crowded configuration. An upstream testing device may bypass the testing signal to a downstream testing device through the device under test, and the status of the device under test may be obtained at the same time to improve test efficiency.

In order for the foregoing content to be understood easier, several embodiments with accompanying drawings are described in detail as follows.

DESCRIPTION OF THE EMBODIMENTS

Some embodiments of the disclosure accompanied with the drawings will now be described in detail. These examples are only a portion of the disclosure and do not disclose all possible embodiments of the disclosure. More precisely, these embodiments are only examples within the scope of the patent application of the disclosure.

Figure 1:
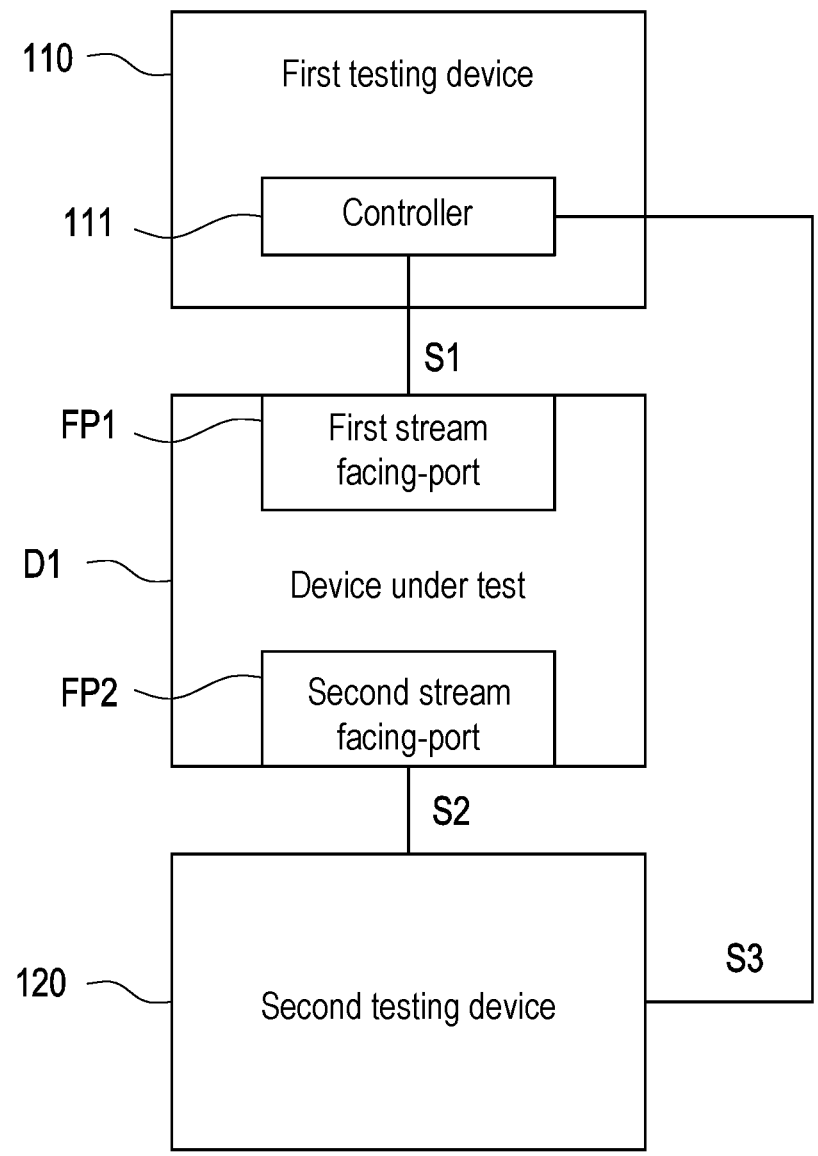
FIG. 1 is a circuit block diagram of a testing system according to an embodiment of the disclosure.

FIG. 1 is a circuit block diagram of a testing system according to an embodiment of the disclosure. Referring to FIG. 1, a testing system 100 may be applied in a test for the USB4 transmission specification. The testing system 100 may also support USB3, USB3 transmitted using tunneling specification (i.e., USB3 tunneling), PCI Express (PCIe), and a display port (DP), etc., that are compatible with the transmission specification of USB4 to test the function of a device under test D1 using various transmission specifications.

In the embodiment of FIG. 1, the testing system 100 may include a first testing device 110 and a second testing device 120. The first testing device 110 may include a controller 111. The first testing device 110 may be coupled to a first stream facing-port FP1 of the device under test D1 through the controller 111. The first stream facing-port FP1 may be, for example, an upstream-facing port (UFP) of the device under test D1. In this embodiment, the first testing device 110 may be, for example, an automatic test equipment (ATE), and may include electronic devices such as display devices, storage devices, mobile phones, tablet computers, notebook computers, desktop computers, or a combination of the foregoing.

In this embodiment, the controller 111 may be, for example, a signal converter, a field programmable gate array (FPGA), a central processing unit (CPU), other programmable general purpose or special-purpose microprocessor, a digital signal processor (DSP), a programmable controller, an application specific integrated circuits (ASIC), a programmable logic device (PLD), other similar devices, or a combination of the foregoing, which may load and execute related firmware or software to achieve control and calculation functions.

In this embodiment, the second testing device 120 is coupled to a second stream facing-port FP2 of the device under test D1. The second stream facing-port FP2 may be, for example, a downstream-facing port (DFP) of the device under test D1. In this embodiment, the second testing device 120 may be, for example, another ATE, and may include electronic devices such as display devices, storage devices, mobile phones, tablet computers, notebook computers, desktop computers, or a combination of the foregoing.

Figure 2:
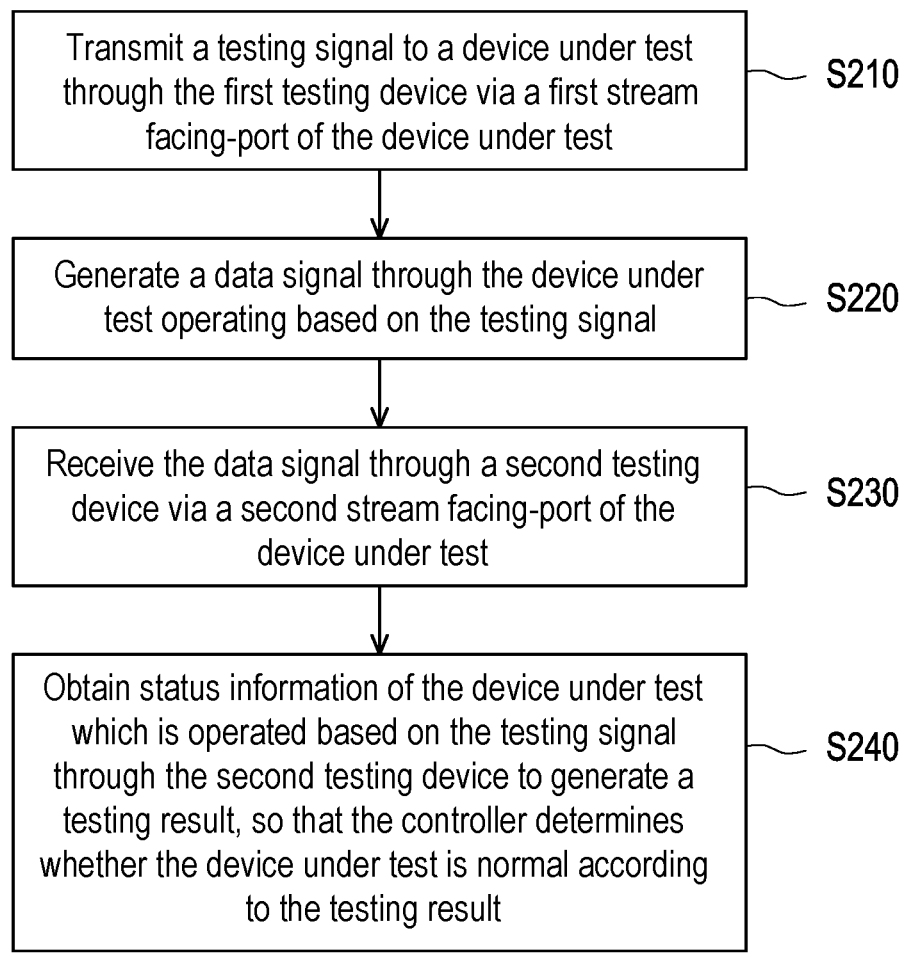
FIG. 2 is a flowchart of a testing method according to an embodiment of the disclosure.

FIG. 2 is a flowchart of a testing method according to an embodiment of the disclosure. Referring to FIG. 1 and FIG. 2, the testing system 100 may execute the testing method shown in steps S210-S240 to test the device under test D1.

In step S210, a testing signal S1 is transmitted to the device under test D1 through the controller 111 of the first testing device 110 via the first stream facing-port FP1 of the device under test D1 to test the USB of the device under test D1. In step S220, a data signal S2 is generated through the device under test D1 operating based on the testing signal S1. That is, the device under test D1 transmits the testing signal S1 and operates based on the current job mode to process and/or bypass the testing signal S1 to form the data signal S2. Next, the device under test D1 outputs the data signal S2 to the second testing device 120 through the second stream facing-port FP2.

In step S230, the data signal S2 output by the device under test D1 is received through a second testing device 120 via a second stream facing-port FP2 of the device under test D1. That is, the second testing device 120 obtains the data signal S2 and obtains the test performance of the device under test D1 for the current job mode according to the data signal S2. The test performance may be, for example, expressed in terms of actual transmission speed.

In step S240, status information of the device under test D1 which is operated based on the testing signal S1 is obtained through the second testing device 120 to generate a testing result S3, so that the controller 111 determines whether the device under test D1 is normal according to the testing result S3 to determine whether the expectations are met. That is, the second testing device 120 obtains the status information and obtains the status of the device under test D1 for the current job mode and other necessary information according to the status information to generates the testing result S3 of the device under test D1 accordingly. The testing result S3 may be represented by, for example, the code of a test pattern or the data signal S2. The controller 111 determines whether the device under test D1 passes one or more test items according to the testing result S3 (e.g., whether the code meets or does not meet the set transmission specification).

It is worth mentioning here that since the testing devices 110 and 120 are connected in series to the stream facing-ports FP1 and FP2 of the device under test D1 in a crowded configuration, an upstream testing device (e.g., testing device 110) may bypass the testing signal S1 to a downstream testing device (e.g., testing device 120) through the device under test D1. At the same time, the testing device 120 may generate a testing result S3 according to the status information. In this way, the device under test D1 operates the testing signal S1 based on the current job mode without executing or processing additional accessed programs or data, and the testing system 100 may improve test efficiency by obtaining the test performance and the testing result S3 through different testing devices 110 and 120 respectively.

Figure 3A:
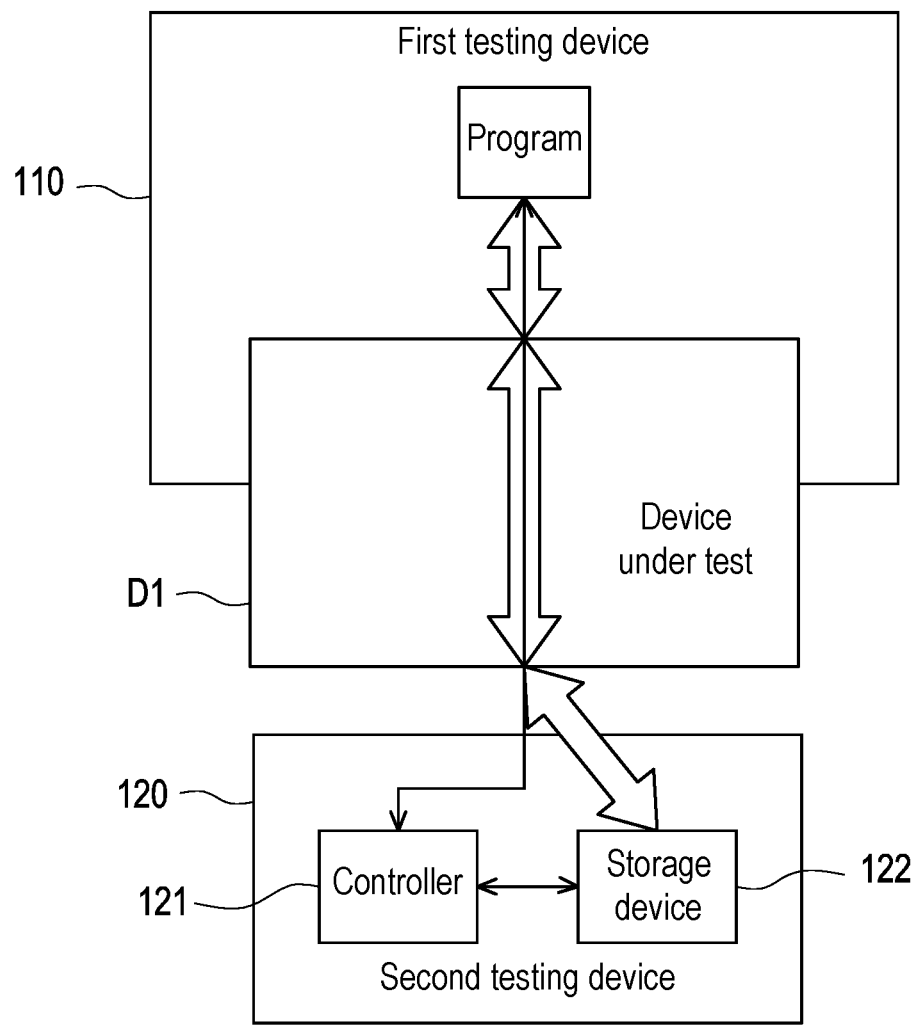
FIG. 3A to FIG. 3B are schematic diagrams of operations of a testing system according to the embodiment of FIG. 1 of the disclosure.
Figure 3B:
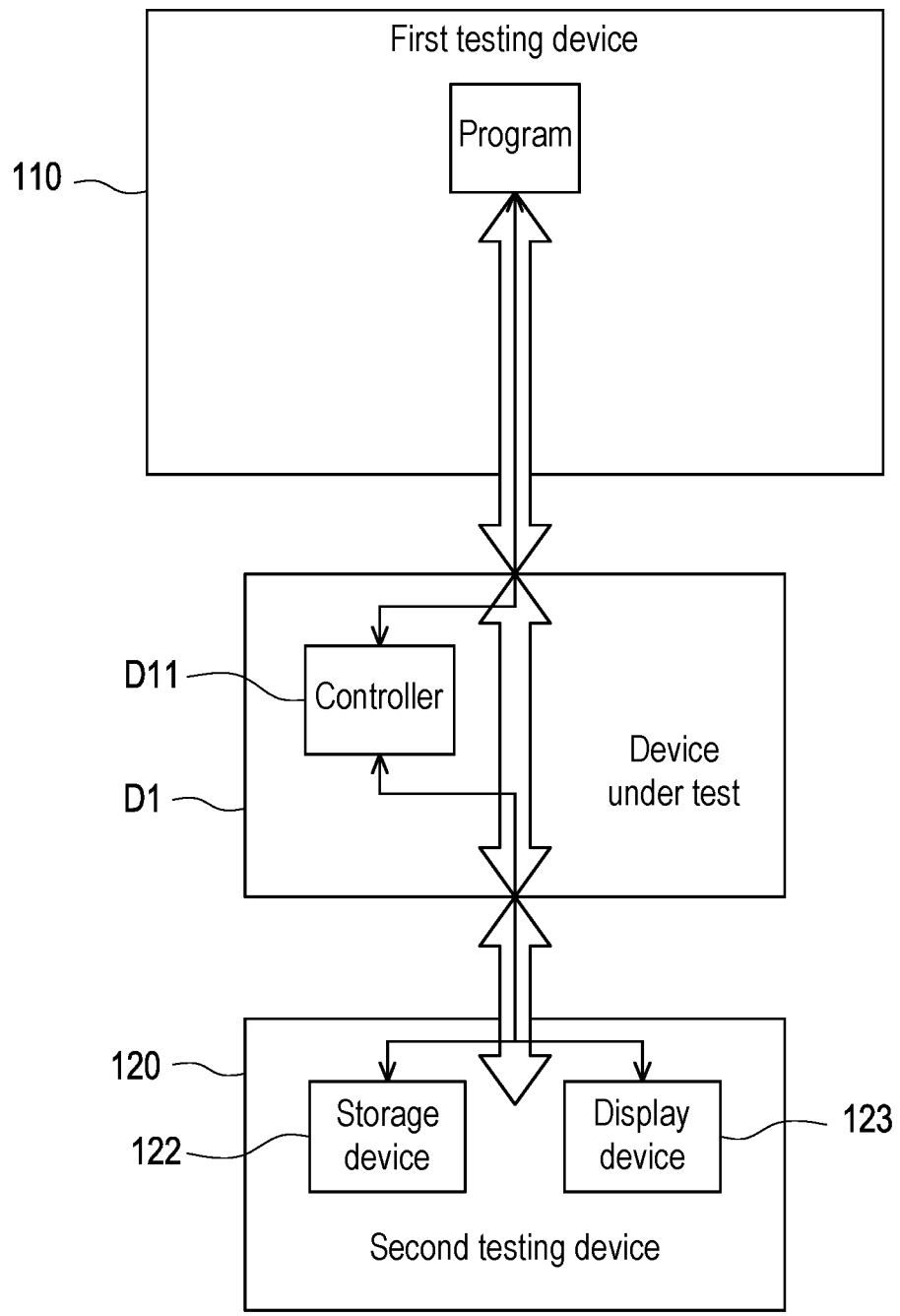

FIG. 3A to FIG. 3B are schematic diagrams of operations of a testing system according to the embodiment of FIG. 1 of the disclosure. Referring to FIG. 1 and FIG. 3A, the first testing device 110 may be applied as a host. The second testing device 120 may be applied as a device. The device under test D1 may operate in host mode and be applied as the host, or may operate in hub mode and be applied as the hub.

In the embodiment of FIG. 3A, the second testing device 120 may include a controller 121 and a storage device 122. The controller 121 is coupled to the storage device 122. The controller 121 may refer to the relevant description of the controller 111 by analogy. The storage device 122 may store various defined transmission specifications and related information, as well as computing software and other related algorithms, programs, and data for realizing control and computing functions. The storage device 122 may be, for example, dynamic random access memory (DRAM), flash memory, or non-volatile random access memory (NVRAM), and the disclosure is not limited thereto.

In this embodiment, the controller 111 (omitted in FIG. 3A) of the first testing device 110 executes a program to generate the testing signal S1. The command and data of the testing signal S1 may be transmitted between the controller 111 and the device under test D1 through a channel (not shown). The transmission of commands may be represented, for example, by thin line arrows, and the transmission of data may be represented, for example, by broad sided arrows.

In this embodiment, a portion of the elements in the device under test D1 (e.g., adapter circuit 531 shown in FIG. 5) may be applied as a portion in the first testing device 110. The portion of the elements is operated based on the command of the testing signal S1 to execute the corresponding setting function and generate the data signal S2. The setting function may be, for example, a function for transmitting a PCIe signal (i.e., PCIe tunneling) using the tunneling specification.

In this embodiment, the device under test D1 transmits data of the data signal S2 to the storage device 122 through the channel. The device under test D1 bypasses the command of the data signal S2 to the controller 121 through the channel. The controller 121 accesses the storage device 122 based on the command and calculates the test performance of the device under test D1 (e.g., the transmission speed of the PCIe signal) according to the accessed data.

Referring to FIG. 1 and FIG. 3B, the first testing device 110 may be applied as a host. The second testing device 120 may be applied as a device. The device under test D1 may operate in hub mode and be applied as a hub, or may operate in device mode and be applied as a device.

In the embodiment of FIG. 3B, the device under test D1 may include a controller D11. The controller D11 may refer to the relevant description of the controller 111 by analogy. On the other hand, the second testing device 120 may include a storage device 122 and a display device 123. The display device 123 may be, for example, liquid crystal displays (LCDs), light-emitting diodes (LED), organic light-emitting diodes (OLEDs), etc., which provide display function for the display device, or it may be, for example, a screen or a TV that uses cold cathode fluorescent lamps (CCFL) or light-emitting diode (LED) as the backlight module.

In this embodiment, the controller D11 in the device under test D1 executes a corresponding vendor command in the controller D11 based on the command of the testing signal S1 to generate the data signal S2 and realize the corresponding setting function. The setting function may, for example, switch the transmission channel of the signal according to the command, so as to bypass the data signal S2 to the second testing device 120 by using the transmission specification to be tested.

In this embodiment, the device under test D1 transmits the data of the data signal S2 to the storage device 122 through the channel, so that the second testing device 120 accesses the storage device 122 based on the command of the data signal S2 and calculates the test performance (e.g., the transmission speed of the PCIe signal) of the device under test D1 to generate the testing result S3. In this embodiment, the device under test D1 transmits the data of the data signal S2 to the display device 123 through the channel, so that the display device 123 displays the data as the testing result S3 (e.g., test pattern) of the device under test D1.

Figure 4:
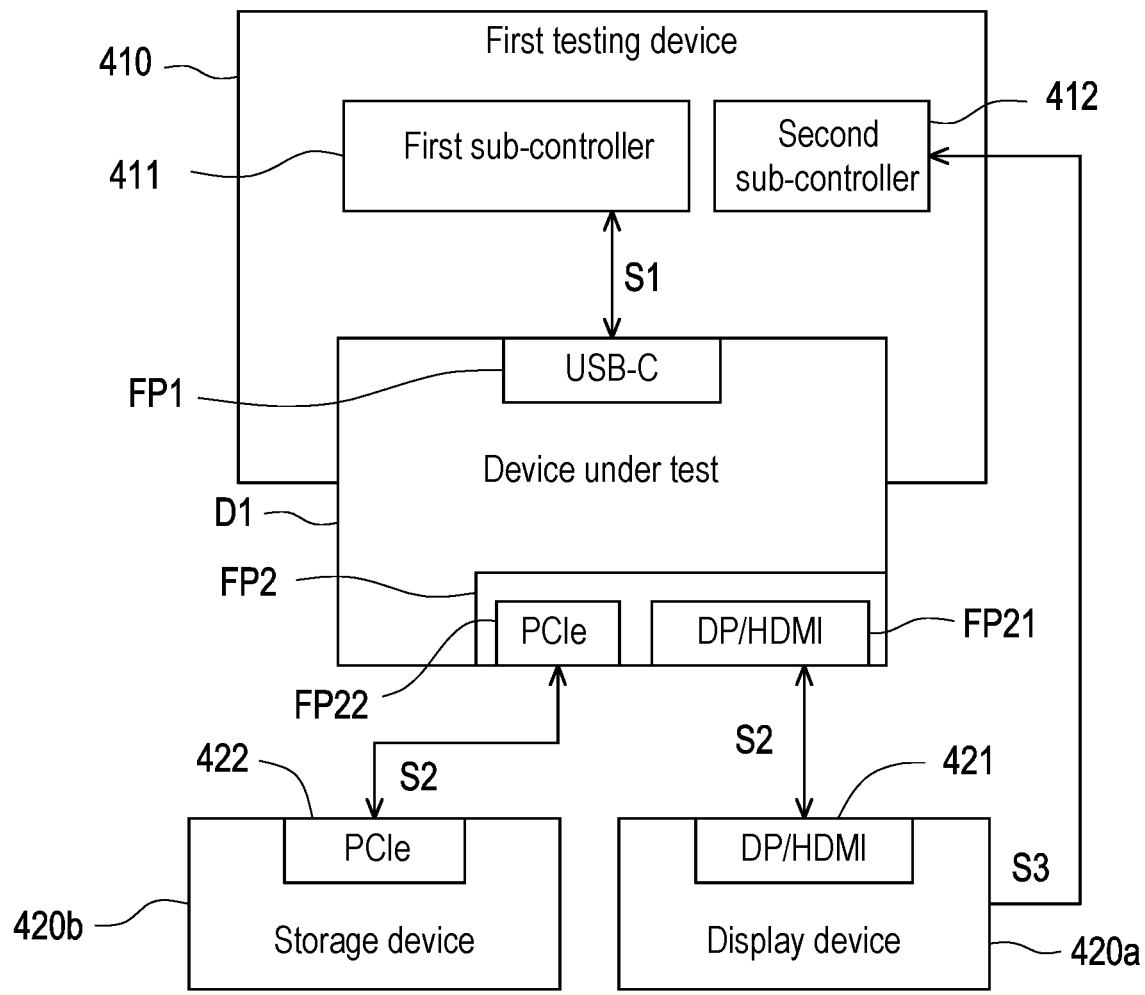
FIG. 4 is a circuit block diagram of a testing system according to another embodiment of the disclosure.

FIG. 4 is a circuit block diagram of a testing system according to another embodiment of the disclosure. Referring to FIG. 4, the testing system 400 may test the functions of the device under test D1 which is operated using various transmission specification. The testing system 400 may include a first testing device 410, and a display device 420a and/or a storage device 420b in a second testing device. The first testing device 410, the display device 420a, and the storage device 420b may refer to the relevant description of the testing system 100 by analogy.

In the embodiment of FIG. 4, the controller of the first testing device 410 may include a first sub-controller 411 and a second sub-controller 412. The first sub-controller 411 is coupled to the first stream facing-port FP1 of the device under test D1 through a control bus. The first stream facing-port FP1 may be, for example, described using a USB Type-C (USB-C) stream facing-port as an example. The first sub-controller 411 may execute a program to generate and transmit the testing signal S1. The first sub-controller 411 may be used as a main test controller of the testing system 400. In this embodiment, the second sub-controller 412 is coupled to the first sub-controller 411 and an output terminal (not shown) of the device under test D1. The second sub-controller 412 may extract the signal of the device under test D1 to obtain the testing result S3 generated by the display device 420a based on the status information. The second sub-controller 412 may be used as a feedback controller of the testing system 400.

In this embodiment, the second stream facing-port FP2 of the device under test D1 may include a first port FP21 and a second port FP22. The first port FP21 of the second stream facing-port FP2 may be, for example, a display port associated with video information or a high definition multimedia interface (HDMI) port as an example. The second port FP22 of the second stream facing-port FP2 may be, for example, described by taking the PCIe port associated with PCIe information as an example.

In this embodiment, the display device 420a may include a first port 421. The first port 421 of the display device 420a is coupled to the first port FP21 in the second stream facing-port FP2. The display device 420a may transmit the data signal S2 with video information through the matching ports 421 and FP21.

In this embodiment, the storage device 420b may include a second port 422. The second port 422 of the storage device 420b is coupled to the second port FP22 in the second stream facing-port FP2. The storage device 420b may transmit the data signal S2 with PCIe information through the matching ports 422 and FP22.

Figure 5:
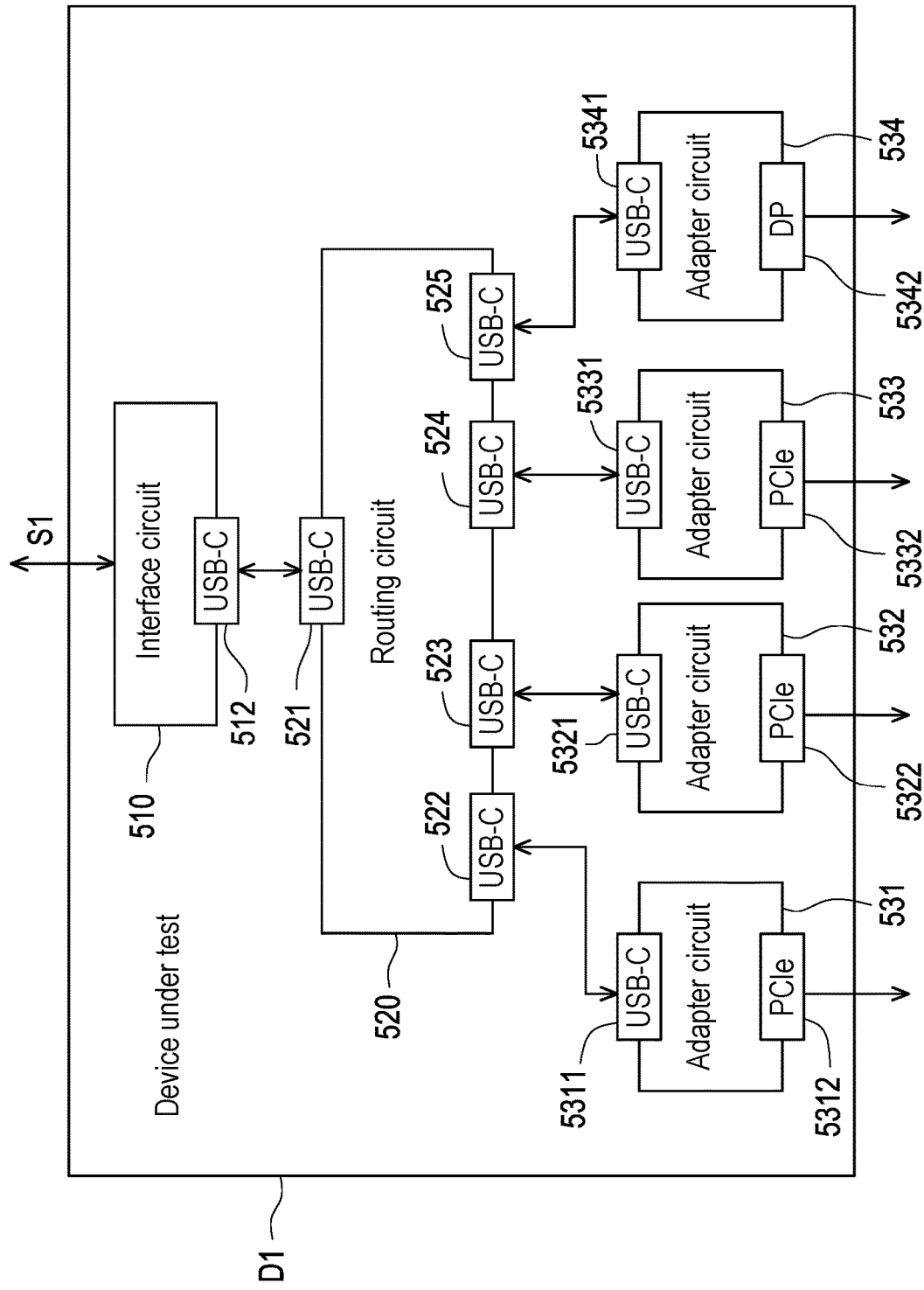
FIG. 5 is a circuit block diagram of a device under test according to the embodiment of FIG. 4 of the disclosure.

Referring to FIG. 5 together, FIG. 5 is a circuit block diagram of a device under test according to the embodiment of FIG. 4 of the disclosure. In the embodiment of FIG. 5, the device under test D1 may include an interface circuit 510, a routing circuit 520, and one or more adapter circuits 531~534. In some embodiments, in response to the adapter circuit 531 being a single configuration, the routing circuit 520 may be omitted.

In this embodiment, an input terminal (not shown) of the interface circuit 510 is coupled to the first stream facing-port FP1. An output terminal 512 of the interface circuit 510 is coupled to the adapter circuits 531~534 through the routing circuit 520.

In this embodiment, the routing circuit 520 includes a first port (e.g., upstream port) 521 and multiple second ports (e.g., downstream port) 522~525. The upstream port 521 of the routing circuit 520 is coupled to the output terminal 512 of the interface circuit 510. The downstream ports 522~525 of the routing circuit 520 are respectively coupled to multiple upstream ports 5311~5341 of the adapter circuits 531~534.

In this embodiment, the adapter circuit 531 includes a first port (e.g., upstream port) 5311 and a second port (e.g., downstream port) 5312. The upstream port 5311 of the adapter circuit 531 is coupled to the output terminal 512 of the interface circuit 510 through the downstream port 522 of the routing circuit 520. The downstream port 5312 of the adapter circuit 531 is coupled to the second stream facing-port FP2 (which may be, for example, the second port FP22). The adapter circuits 532~534 may refer to the related description of the adapter circuit 531 by analogy.

In this embodiment, each circuit (or element) in the device under test D1 is connected to each other through the port of the same transmission specification, and may be described by using the USB-C port as an example. The aforementioned connection may be, for example, a passive cable or an active cable for long distance that meets the USB4 transmission specification. Specifically, the output terminal 512 of the interface circuit 510, the upstream port 521 and the downstream port 522 of the routing circuit 520, and the upstream ports 5311~5341 of the adapter circuits 531~534 conform to the same transmission specification respectively (i.e., USB-C). In this embodiment, the downstream port 5312 of the adapter circuit 531, the downstream port 5322 of the adapter circuit 532, and the downstream port 5332 of the adapter circuit 533 meets the same another transmission specification, and may be described by using a PCIe port as an example. The downstream port 5342 of the adapter circuit 534 meets other types of transmission specification, and may be illustrated by taking a DP or a HDMI port as an example.

Specifically, the adapter circuit 531 may, for example, convert the signal between the USB4 transmission specification and the PCIe transmission specification in accordance with the USB4 transmission specification, and may use the tunneling specification to output the PCIe signal (i.e., PCIe tunneling). The adapter circuit 531 may be applied as a USB4 and a PCIe tunneling mode circuit. In this embodiment, the adapter circuit 532 and the adapter circuit 534 may refer to the relevant description of the adapter circuit 531 by analogy. The adapter circuit 532 may be applied as a USB4 and USB3 tunneling mode circuit, and the adapter circuit 534 may be applied as a USB4 and DP tunneling mode circuit. In this embodiment, the adapter circuit 533 may, for example, convert the signal between the USB4 transmission specification and the PCIe transmission specification in accordance with the USB4 transmission specification, and may use the speed specification to output the PCIe signal. The adapter circuit 533 may be applied as a USB4 and USB3 legacy mode circuit.

In this embodiment, in response to the device under test D1 operating in PCIe tunneling mode through the adapter circuit 531, the data signal S2 is transmitted to the storage device 420b through the downstream port 5312. Another controller coupled to the storage device 420b may access the data signal S2 and execute a PCIe read and write command to obtain the transmission speed in this mode. In this embodiment, in response to the device under test D1 operating in USB3 tunneling mode through the adapter circuit 532, the data signal S2 is transmitted to the storage device 420b through the downstream port 5322. Another controller accesses the data signal S2 and executes a USB read and write command to obtain the transmission speed in this mode. The operation of the device under test D1 in the DP tunneling mode or the PCIe legacy mode may refer to the above description by analogy.

Figure 6A:
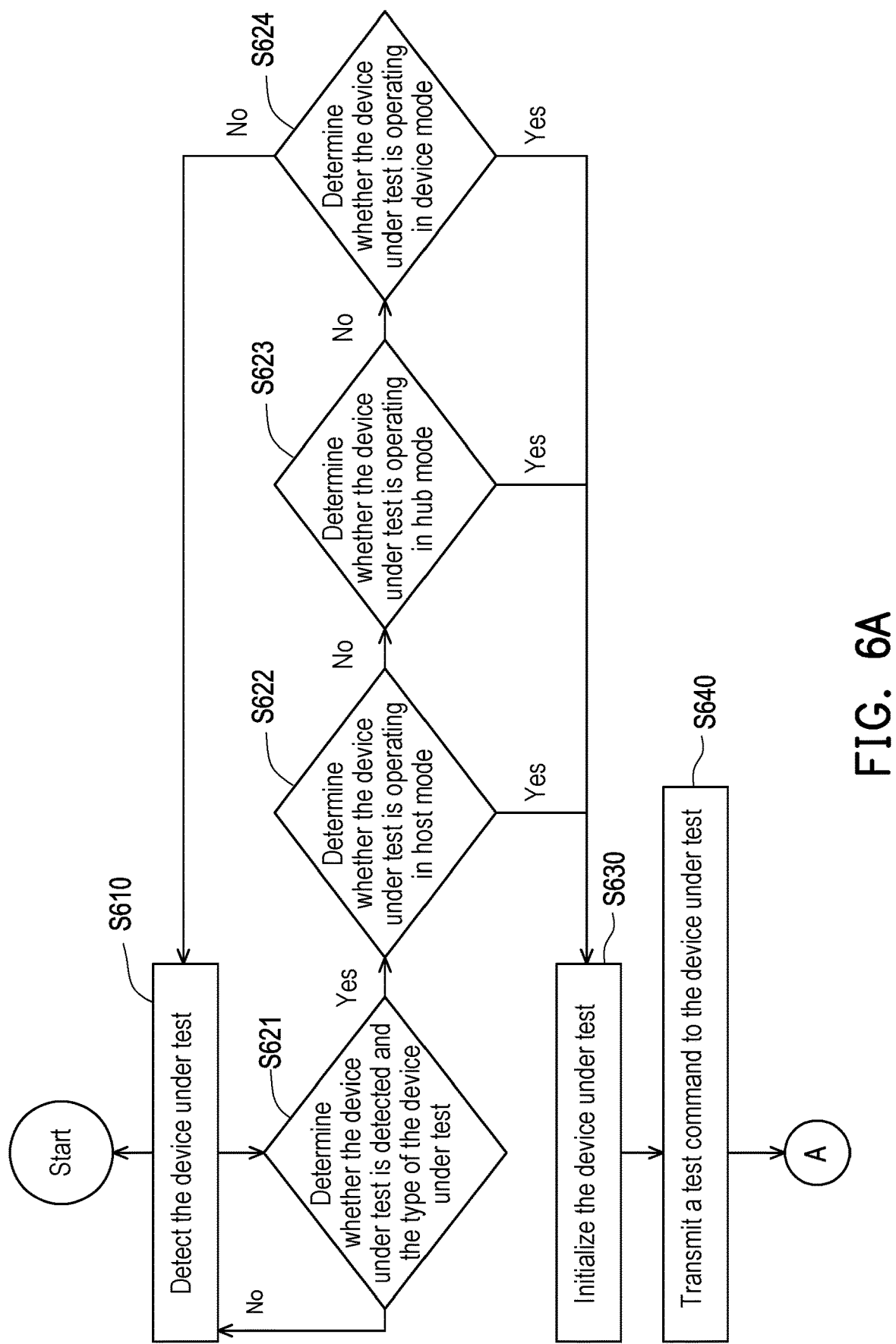
FIG. 6A to FIG. 6B are flowcharts of a testing method according to another embodiment of the disclosure.
Figure 6B:
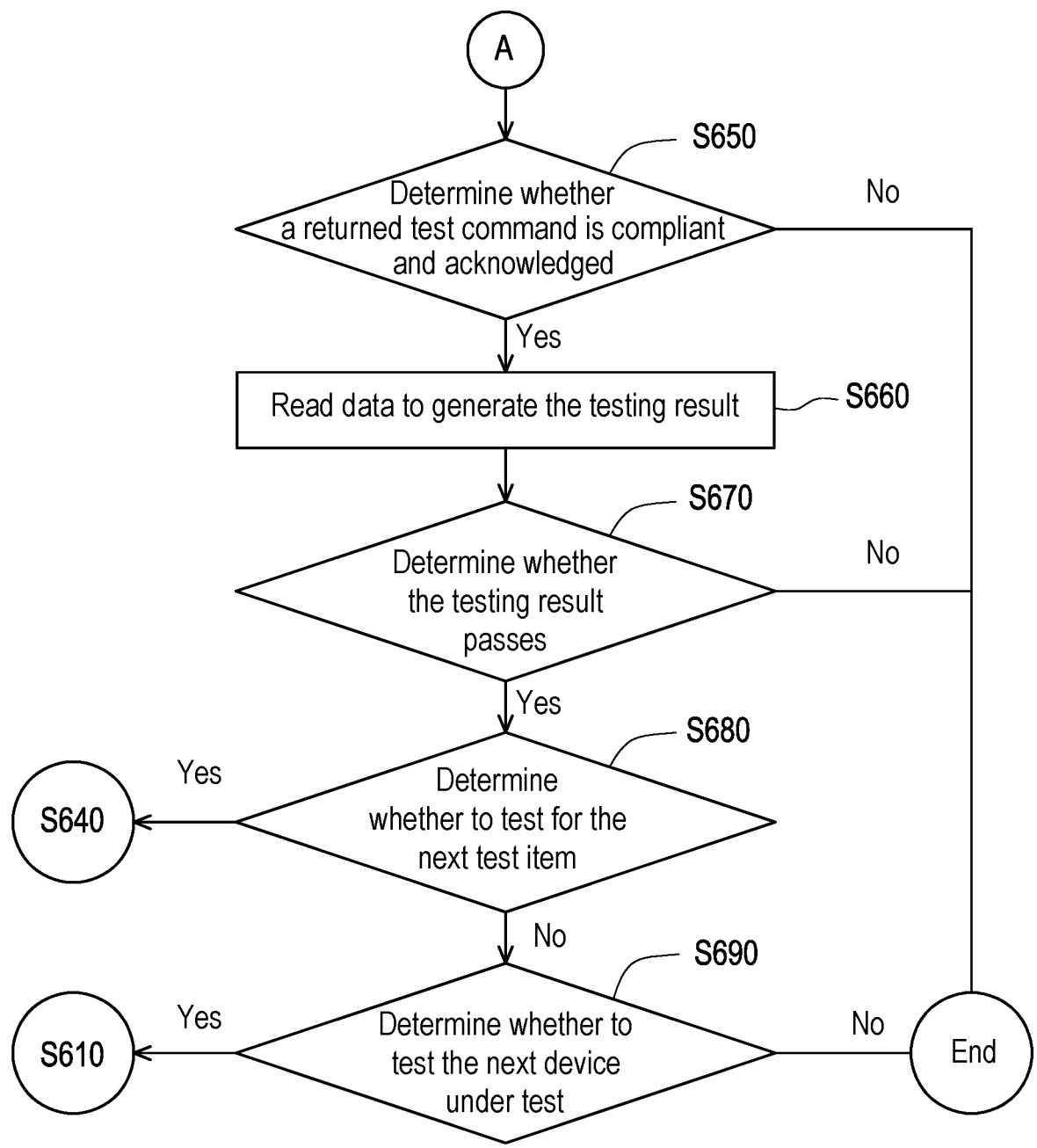

FIG. 6A to FIG. 6B are flowcharts of a testing method according to another embodiment of the disclosure. Referring to FIG. 4 to FIG. 6B, the testing system 400 may execute the testing method shown by steps S610~S690 for testing the device under test D1.

In step S610, the first sub-controller 411 executes an element detection procedure in the program to detect the device under test D1. That is, the first sub-controller 411 sets a target to be the device under test D1 through the aforementioned procedure.

In step S621, the first sub-controller 411 executes the program to determine whether the first sub-controller 411 detects the device under test D1 and the type of the device under test D1. In response to the first sub-controller 411 detecting the device under test D1, the first sub-controller 411 further determines the type of the device under test D1 to get the transmit interface (e.g., legacy) of the device under test D1. In addition, in response to the first sub-controller 411 detecting the device under test D1, the first sub-controller 411 further determines the operation mode of the device under test D1 to proceed to steps S622~S624. Conversely, in response to the first sub-controller 411 not detecting the device under test D1, the first sub-controller 411 executes step S610 again.

In step S622, the first sub-controller 411 executes the program to determine whether the device under test D1 is operating in host mode. In response to the device under test D1 operating in host mode, the first sub-controller 411 executes step S630. Conversely, the first sub-controller 411 executes step S623, so that the first sub-controller 411 executes the program to determine whether the device under test D1 is operating in hub mode. In response to the device under test D1 operating in hub mode, the first sub-controller 411 executes step S630. Conversely, the first sub-controller 411 executes step S624, so that the first sub-controller 411 executes the program to determine whether the device under test D1 is operating in device mode. In response to the device under test D1 operating in device mode, the first sub-controller 411 executes step S630. Conversely, the first sub-controller 411 executes step S610 again.

In step S630, the first sub-controller 411 initializes the device under test D1 based on the corresponding operation mode. Specifically, in response to the device under test D1 operating in host mode, the interface circuit 510 and the routing circuit 520 are set as a portion of the elements of the first sub-controller 411 so as to be controlled by the first sub-controller 411. The adapter circuit 531 may also be set as a portion of the elements of the first sub-controller 411 so as to be forced to perform operations of the USB4 and PCIe tunneling mode circuits. The adapter circuits 532~534 may refer to the related description of the adapter circuit 531 by analogy.

Continuing the above description, in response to the device under test D1 operating in hub mode or device mode, the interface circuit 510 and the routing circuit 520 are set as an element under test. The adapter circuits 531~534 may also be set as the element under test, respectively. The device under test D1 may execute the built-in vendor command to switch one of the adapter circuits 531~534, so that a switched (or selected) adapter circuit performs the operation of the corresponding mode.

In step S640, the first sub-controller 411 transmits a test command to the device under test D1. The test command may be, for example, a transmission packet generated according to the specification of the device under test D1 and the testing mode, which conforms to the transmission protocol to be tested, so as to instruct the device under test D1 to perform the test operation.

In step S650, the device under test D1 returns a command reply slip corresponding to the test command, so that the first sub-controller 411 determines whether the returned test command is compliant and acknowledged. In response to the result of step S640 being "yes", it indicates that the first sub-controller 411 and the device under test D1 have agreed on the test operation, and the testing system 400 continues with step S660. Conversely, in response to the result of step S640 being "no", it indicates that the first sub-controller 411 and/or the device under test D1 negate the test operation, and the testing system 400 ends the testing method.

In step S660, the first sub-controller 411 executes the program based on the corresponding operation mode to perform the test operation on the device under test D1, and the display device 420a receives the data (e.g., status information) in the foregoing operation to generate (or display) the testing result S3. It should be noted that the first sub-controller 411 may detect the connection or transmission speed of the device under test D1 according to the data signal S2. Moreover, the display device 420a may simultaneously detect the status of each of the elements in the device under test D1 according to the status information to generate the testing result S3, so as to improve the test efficiency.

In detail, in response to the device under test D1 operating in host mode, the testing system 400 may execute the control method shown in FIG. 2. Regarding the implementation details of step S230, the adapter circuits 531~534 are respectively forced to execute corresponding modes and operate based on testing signal S1 to generate corresponding data signal S2.

On the other hand, in response to the device under test D1 operating in hub mode or device mode, the testing system 400 may execute the control method shown in FIG. 2. Regarding the implementation details of step S230, the device under test D1 (e.g., routing circuit 520) executes a vendor command to switch and select one of the adapter circuits 531~534. Then, the switched one of the adapter circuits 531~534 operates based on the testing signal S1 to generate the corresponding data signal S2.

In step S670, the first sub-controller 411 determines whether the testing result S3 passes according to the transmission specification and corresponding test items in a test checklist to indicate whether the device under test D1 meets or does not meet the expected specification. In response to the result of step S670 being "yes", it indicates that the testing result S3 meets the specification for the current test items, and the first sub-controller 411 executes step S680. Conversely, in response to the result of step S670 being "no", it indicates that the testing result S3 does not meet the specification for the current test items, and the testing system 400 ends the testing method.

In step S680, the first sub-controller 411 determines whether to test for the next test item of the device under test D1 according to the test checklist. In response to the result of step S680 being "yes", the first sub-controller 411 executes step S640 again. Conversely, in response to the result of step S680 being "no", the testing system 400 executes step S690.

In step S690, the first sub-controller 411 determines whether to test the next device under test according to the test checklist. In response to the result of step S690 being "yes", the first sub-controller 411 executes step S610 again. Conversely, in response to the result of step S690 being "no", the testing system 400 ends the testing method.

To sum up, the testing system and the testing method of the embodiment of the disclosure are connected in series in a crowded manner between the upstream-facing port and the downstream-facing port of the device under test through multiple testing devices, which enables the device under test to bypass the testing signal to one of the testing devices. Moreover, at the same time, another testing device reads the status of the device under test to generate a testing result. In this way, the device under test does not need to execute or process additional accessed programs or data, and may perform various transmission specification tests, so that the testing system may improve test efficiency. On the other hand, since the testing system may support multiple transmission specifications and multiple modes of testing, the testing system may be applied to the test of related products such as USB, PCIe, and/or DP.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A testing system, comprising:
   a first testing device, coupled to a first stream facing-port of a device under test and comprising a controller, wherein the controller is configured to transmit a testing signal to the device under test through the first stream facing-port to test a universal serial bus (USB) of the device under test, and
   the testing signal comprises a test command and the test command is configured to instruct the device under test to operate in a tunneling mode and perform a test operation to generate a data signal, wherein the test operation corresponds to a vendor command of the device under test; and
   a second testing device, coupled to a second stream facing-port of the device under test,
   wherein the second testing device is configured to receive the data signal through the second stream facing-port from the device under test and the data signal comprises information corresponding to a type of the second stream facing-port,
   the second testing device is configured to obtain status information of the device under test in response to the test operation to generate a testing result, and
   the controller determines whether the device under test is normal according to the testing result.

2. The testing system according to claim 1, wherein the controller comprises:
   a first sub-controller, coupled to the first stream facing-port to transmit the testing signal; and
   a second sub-controller, coupled to the first sub-controller and an output terminal of the device under test to obtain the testing result.

3. The testing system according to claim 1, wherein the second testing device comprises:
   a display device, having a first port, wherein the first port of the display device is coupled to a first port of the second stream facing-port to transmit the testing signal with video information.

4. The testing system according to claim 1, wherein the second testing device comprises:
   a storage device, having a second port, wherein the second port of the storage device is coupled to a second port of the second stream facing-port to transmit the testing signal with PCI Express information.

5. The testing system according to claim 1, wherein the device under test comprises:
   an interface circuit, coupled to the first stream facing-port; and
   at least one adapter circuit, having a first port conforming to a first transmission specification and a second port conforming to a second transmission specification, wherein the first port of the at least one adapter circuit is coupled to the interface circuit, and the second port of the at least one adapter circuit is coupled to the second stream facing-port.

6. The testing system according to claim 5, wherein the at least one adapter circuit is a plurality of adapter circuits, wherein the device under test further comprises:
   a routing circuit, comprising a first port and a plurality of second ports conforming to the first transmission specification, wherein the first port of the routing circuit is coupled to the interface circuit, and the second ports of the routing circuit are respectively coupled to the first ports of the adapter circuits.

7. The testing system according to claim 1, wherein in response to the device under test operating in a host mode, a plurality of adapter circuits of the device under test operate respectively based on the testing signal to generate a corresponding data signal.

8. The testing system according to claim 1, wherein in response to the device under test operating in a hub mode or a device mode, a switched one of adapter circuits of the device under test operates based on the testing signal to generate a corresponding data signal.

9. A testing method, comprising:
   transmitting a testing signal to a device under test through a controller of a first testing device via a first stream facing-port of the device under test to test a USB of the device under test,
   wherein the controller is coupled to the first stream facing-port, and the testing signal comprises a test command and the test command is configured to instruct the device under test to operate in a tunneling mode and perform a test operation to generate a data signal, wherein the test operation corresponds to a vendor command of the device under test;

receiving the data signal output by the device under test through a second testing device via a second stream facing-port of the device under test,
wherein the second testing device is coupled to the second stream facing-port, and
the data signal comprises information corresponding to a type of the second stream facing-port;

obtaining status information of the device under test in response to the test operation to generate a testing result; and determining whether the device under test is normal according to the testing result.

* * * * *